United States Patent
Hastings et al.

(10) Patent No.: US 7,259,546 B1
(45) Date of Patent: Aug. 21, 2007

(54) TEMPERATURE COMPENSATING INTEGRATED ANTI-DIFFERENTIAL CURRENT SENSING SYSTEM

(75) Inventors: Jerome K. Hastings, Sussex, WI (US);
Dale L. Gass, Brown Deer, WI (US);
Birger Pahl, Milwaukee, WI (US);
Davin R. Lee, Watertown, WI (US);
James E. Hansen, Franklin, WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/162,220

(22) Filed: Sep. 1, 2005

Related U.S. Application Data

(63) Continuation of application No. 10/711,746, filed on Oct. 1, 2004.

(60) Provisional application No. 60/507,896, filed on Oct. 1, 2003.

(51) Int. Cl.
*G01R 15/20* (2006.01)

(52) U.S. Cl. .................. 324/117 H; 324/126; 324/127

(58) Field of Classification Search ..... 324/117 R–117 H, 126–127, 250–252
See application file for complete search history.

(56) References Cited

U.S. PATENT DOCUMENTS

| | | | |
|---|---|---|---|
| 4,283,643 A | * | 8/1981 | Levin .................. 327/511 |
| 5,041,780 A | | 8/1991 | Rippel |
| 6,819,095 B1 | * | 11/2004 | Dubhashi et al. ....... 324/117 H |
| 2003/0062886 A1 | | 4/2003 | Hastings et al. |
| 2003/0151406 A1 | | 8/2003 | Wan et al. |

FOREIGN PATENT DOCUMENTS

| | | |
|---|---|---|
| CA | 2 368 901 A1 | 10/2000 |
| DE | 298 18 370 U1 | 1/1999 |
| DE | 199 14 772 A1 | 10/2000 |
| DE | 102 33 129 A1 | 2/2003 |
| EP | 0 538 658 A1 | 4/1993 |
| GB | 2 255 645 A | 11/1992 |
| JP | 57062510 | 4/1982 |

* cited by examiner

*Primary Examiner*—Vinh P. Nguyen
(74) *Attorney, Agent, or Firm*—Ziolkowski Patent Solutions Group, SC

(57) ABSTRACT

A system for current sensing includes a first Hall effect sensor and a second Hall effect sensor constructed to provide feedback indicating current flow through a conductor susceptible to external magnetic flux. A housing is configured to position the first Hall effect sensor and the second Hall effect sensor about the conductor to provide generally magnitude equal feedback of the current flow through the conductor and generally polarity opposite feedback of the external magnetic flux.

39 Claims, 7 Drawing Sheets

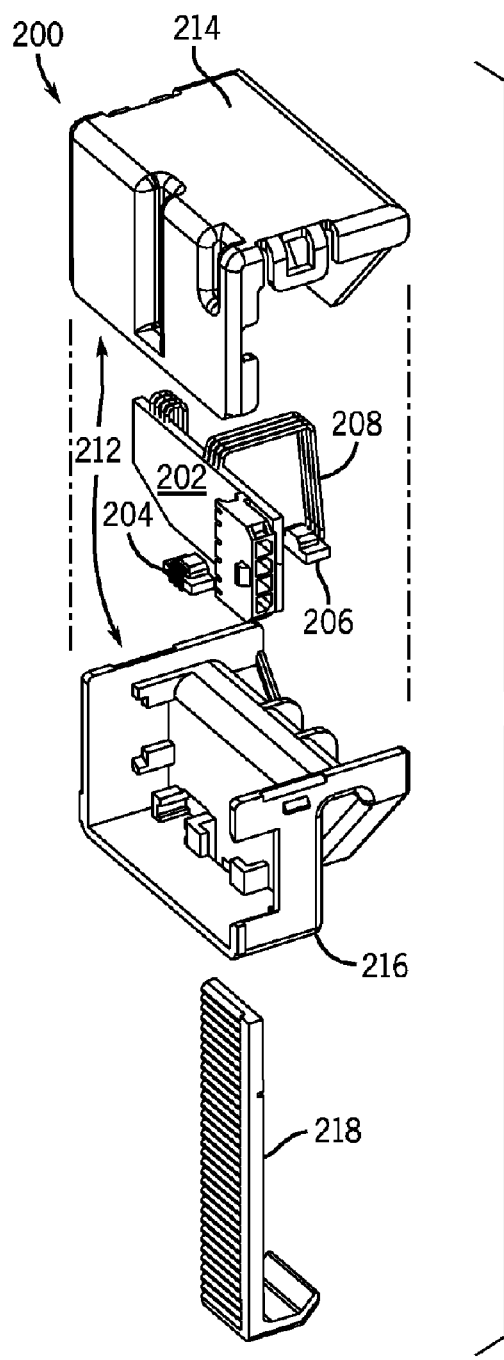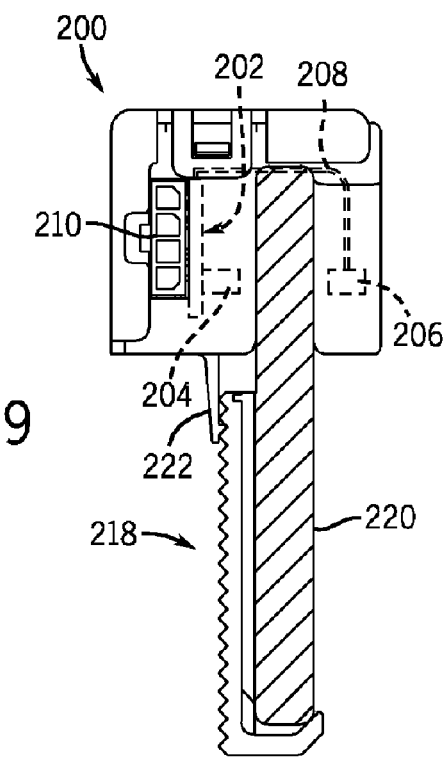
FIG. 9
FIG. 10

TEMPERATURE COMPENSATING INTEGRATED ANTI-DIFFERENTIAL CURRENT SENSING SYSTEM

CROSS-REFERENCE TO RELATED APPLICATIONS

The present invention is a continuation and claims priority of U.S. patent application Ser. No. 10/711,746 filed Oct. 1, 2004, the disclosure of which is incorporated herein. U.S. patent application Ser. No. 10/711,746 claims the benefit of prior U.S. Provisional Application Ser. No. 60/507,896 filed Oct. 1, 2003.

BACKGROUND OF THE INVENTION

The present invention relates generally to current measuring and monitoring, more particularly, to a system and method for measuring current by sensing magnetic flux associated with current flow through a conductor. A dual Hall sensor configuration arranged according to an anti-differential topology is utilized to sense magnetic flux and provides feedback to a processing component. The processing component is arranged to generate an anti-differential output from the feedback received to remove feedback attributable to magnetic fields induced externally from the conductor. The anti-differential current sensor is disposed in a housing configured to arrange the Hall effect sensors, processing component, and other integrated systems in the anti-differential topology with respect to the conductor being monitored.

Measuring and monitoring of current flow through a conductor is an important analysis that is performed in a wide variety of applications and circumstances. Current sensing designs often fall into one of two categories: contact topologies and non-contact topologies.

Contact sensors are common in many circumstances but include many inherent limitations. For example, while shunt-type sensors are readily applicable to direct current (DC) applications, shunt-type sensors are not suited to alternating current (AC) applications due to errors caused by induced loop voltages. On the other hand, while current transformers (CT) are suited for AC applications, such are inapplicable to DC applications due to the fundamental nature of transformers.

In any case, these contact-based sensor systems are typically large and may be difficult to employ, especially in areas where tight size constraints are necessary. Specifically, in order to deploy a contact-based sensor, such as a resistive shunt, it is necessary to remove the conductor from service. Additionally, shunt based sensors require lugs to form an electrical connection and a mounting means to secure the device in position. Similarly, CT-based sensors necessarily require adequate accommodations for a transformer.

Non-contact current sensing designs are often preferred in many applications because they reduce common mode noise typically experienced with direct contact designs, such as shunts. Non-contact designs also reduce heat buildups often associated with resistive shunts and the need to use burdened current transformers. Additionally, non-contact designs provide scalable outputs that are desirable for use with digital controllers.

A variety of designs and approaches have been developed for non-contact current monitoring systems. One common and desirable form of non-contact sensing and monitoring of current flow includes indirectly determining current flow through a conductor by detecting a magnetic field or flux induced as a result of the current flow through the conductor.

For example, metal core based systems are often used to measure the current flow through a conductor by detecting the magnetic flux induced by the current flow. The metal core is utilized to magnify the magnetic flux concentration and, thereby, provide increased accuracy in detecting the magnetic flux and the extrapolated current readings. Various topologies including "open-loop," "closed-loop," "flux gate," and "dithering" designs may be utilized, although all include limitations.

Open-loop sensors use the magnetic properties of the metal core material to magnify the magnetic flux induced by the current flow through the conductor. However, to extrapolate the current measurements from the detected magnetic flux, these sensors rely on the "near linear" operational range of the metal core. A ferromagnetic core that enters a "saturation" operational range can distort the reported current compared to the actual current profile. Specifically, as saturation is reached, a current level that changes with time produces a time changing magnetizing force that produces a time changing magnetic flux density within the core. That is, as the core material approaches magnetic saturation, the "magnetic gain" declines and approaches the "magnetic gain" of air. As such, the magnetic field within the metal core is distorted in proportion to the difference in permeability at various points along a hysteresis loop of the metal core. Therefore, should the operating conditions lead to the saturation of the metal core, inaccurate current measurements may be gathered. Accordingly, sensing ranges of metal core sensors are typically hard-limited to the "near-linear" operational range.

Additionally, sensors relying on metal cores can experience hysteresis in the metal core that may produce a zero current offset error. Specifically, when at low or zero current levels, the metal core may act as a weak permanent magnet and report a persistent flux though little or no current is actually present. As such, zero offsets are particularly troublesome when monitoring DC power systems. As all permeable ferromagnetic materials exhibit some level of hysteresis, which produces an error at zero current, metal core sensors are susceptible to erroneous current measurements at low or no current levels. Furthermore, increased inductance can produce phase shifts between the actual current profile and the reported current profile.

Furthermore, while electronic-based sensors are typically limited by the voltage rails used in the sensor output stages, current sensors employing metal cores have an additional limitation imposed by the saturation point of the material. For example, a sensor with a scale factor of 1 volt per amp with a 5 volt rail will be limited to 5 amps regardless of the range of the detector. In metal core based sensors it is well known that the dynamic range is typically limited to 10:1. Therefore, it is known that metal core current sensors include range, accuracy, and repeatability limits in proportion to the propensity for hysteresis, saturation, and non-linearity of the material used in the core.

"Closed-loop" sensors, flux gate approaches, and dithering approaches utilize a combination of electronic circuits and bucking coils to compensate for these material related errors and/or average-out errors. However, these systems merely diminish the effects of the errors, and do not entirely eliminate the potential for errors and incorrect current readings.

Accordingly, in order to eliminate the potential for inaccurate current measurements due to metal core saturation, hysteresis, or eddy currents, air-core sensors may be used to measure and monitor current. However, while the removal of the metal core eliminates the potential for inaccurate current measurements due to metal core saturation, hysteresis, or eddy currents, the air core does not have the magnetic flux magnifying or concentrating effect of metal cores. Therefore, air-core current sensors are readily susceptible to influence by external magnetic fields and may provide inaccurate current measurements. As such, air-core sensors are typically unsuitable for applications where multiple high external magnetic fields are present. As an overwhelming percentage of current sensors are required to be deployed in areas where numerous conductors and corresponding magnetic fields are in close proximity, air-core sensors are often undesirable.

It would therefore be desirable to design a system and method for non-contact current sensing that does not rely on ferromagnetic materials and is not susceptible to magnetic fields induced externally from the monitored conductor. That is, it would be desirable to have a system and method for non-contact current sensing that does not include the inherent limitations of metal-core based current sensors while providing accurate current feedback in the presence of external magnetic fields. Furthermore, it would be desirable to have a system and method for concentrating magnetic flux associated with a particular conduction to increase monitoring accuracy. Additionally, it would be desirable that such a system and method be integrated with a variety of systems and subsystems to communicate sensed current levels.

BRIEF DESCRIPTION OF THE INVENTION

The present invention is directed to a system and method that overcomes the aforementioned drawbacks. Specifically, an anti-differential, error correcting, sensor topology is utilized that eliminates the need for ferromagnetic concentrators. As such, the sensor eliminates the limitations associated with metal-core based current sensors and is capable of providing accurate current monitoring in the presence of external magnetic fields. Furthermore, the sensor is configured to communicate with a variety of systems and subsystems, such as communications interfaces, breaking and tripping systems, and the like.

In accordance with one aspect of the invention, a current sensor is disclosed that includes a first Hall effect sensor and a second Hall effect sensor constructed to provide feedback indicating current flow through a conductor susceptible to external magnetic flux. A housing is configured to position the first Hall effect sensor and the second Hall effect sensor about the conductor to provide generally magnitude equal feedback of the current flow through the conductor and generally polarity opposite feedback of the external magnetic flux.

According to another aspect of the invention, a current sensor is disclosed including a PC board configured to receive a plurality of components and a conductive path disposed proximate to the PC board. A first Hall effect sensor and a second Hall effect sensor are each configured to be mounted to the PC board and adjacent the conductive path to provide feedback indicating a current flow through the conductive path. A processing component is configured to receive the feedback from the first Hall effect sensor and the second Hall effect sensor and calculate an anti-differential output from the feedback that substantially removes feedback in response to magnetic flux induced externally from the conductive path.

In accordance with another aspect, the invention includes a current sensing system that includes a conductor configured to conduct a current flow therethrough and a housing configured to be mounted to the conductor. A first Hall effect sensor is configured to be fixed within the housing and to provide a first indication of current flow through the conductor and a second Hall effect sensor is configured to be fixed within the housing and to provide a second indication of current flow through the conductor. A processing component is configured to receive the first indication of current flow and the second indication of current flow and calculate at least one of a sum and a difference of the first indication of current flow and the second indication of current flow to generate an anti-differential output that reduces errors generated by magnetic fields induced thereon from sources external from the conductive path.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 9 is a perspective exploded view of an alternate embodiment of the integrated current sensing system of FIG. 4, in accordance with the present invention.

FIG. 10 is a side view of the integrated current sensing system of FIG. 9, in accordance with the present invention.

DETAILED DESCRIPTION OF THE PREFERRED EMBODIMENT

The present invention is related to a system and method for anti-differential, error-correcting current sensing. A plurality of magnetic flux sensors is arranged about a conductor and provides feedback to a processing component or device configured to generate an output with reduced feedback induced by magnetic fields external to the conductor. The plurality of magnetic flux sensors may be disposed in geometrically designed recesses configured to amplify the magnetic flux received by the plurality of magnetic flux sensors. The system may be disposed in a variety of configurations designed for optimal disposition of the plurality of magnetic flux sensors about a given conductor type. Some examples of possible configurations include etched spiral path topologies for low current and printed circuit board current sensing, dual-spiral and spiral-helix topologies for contact based current sensing, and wire and bus bar mount topologies for wire and bus bar conductors. Furthermore, the system may be integrated with additional systems and subsystems that utilize current sensing as well as communication interfaces.

Figure 1:
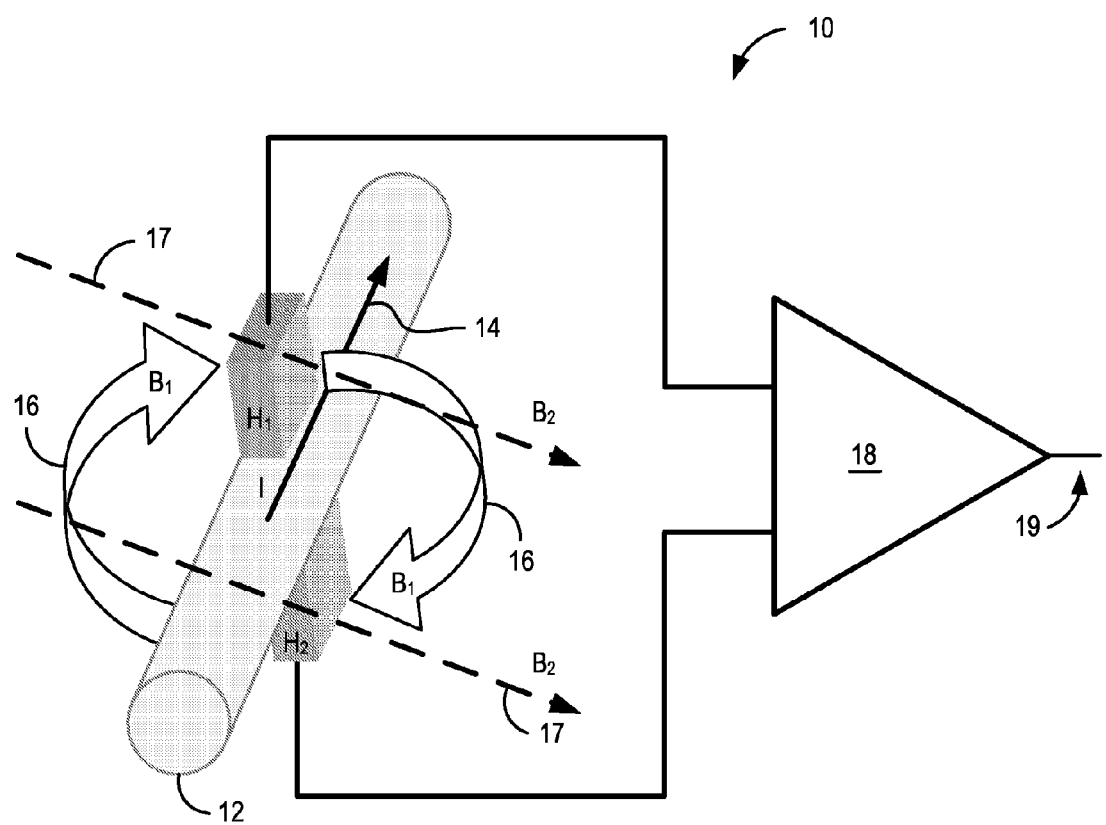
FIG. 1 is a perspective diagram of an anti-differential current sensor configuration in accordance with the present invention.

Referring to FIG. 1, a perspective view is shown of an anti-differential current sensor configuration 10 arranged about a conductor 12 in accordance with the present invention. The conductor 12 is illustrated as a round wire for exemplary purposes only but, as will be described, may include any form of current conductor including bus bars, integrated circuits, printed circuit boards, circuit breakers, and the like. The conductor includes a current flow therethrough, as illustrated by an arrow 14 and labeled "I." As is well known, the current flow 14 through the conductor 12 induces a magnetic field, as illustrated by arrows 16, labeled "$B_1$." Two magnetic flux sensors $H_1$, $H_2$, preferably Hall effect sensors, are disposed on substantially opposite sides of the conductor 12. The positioning of the Hall effect sensors $H_1$, $H_2$ on substantially opposite sides of the conductor 12 aids in reducing the effects of externally induced magnetic fields, labeled "$B_2$" and illustrated by arrows 17, that can otherwise cause inaccurate readings of the current 14 through the conductor 12. That is, the two current sensors $H_1$, $H_2$ are used in a configuration that reports the current inside the conductor 12 to a processing component 18 that is configured to calculate a sum or summed difference of the feedback from the two current sensors $H_1$, $H_2$ to generate an anti-differential output having reduced influences from externally induced magnetic fields $B_2$ 17. Specifically, the anti-differential current sensor configuration 10 provides an anti-differential output 19 that is a highly accurate indication of the current flow 14 through the conductor 12 and is substantially free of influence from externally induced magnetic fields $B_2$ 17.

Figure 2:
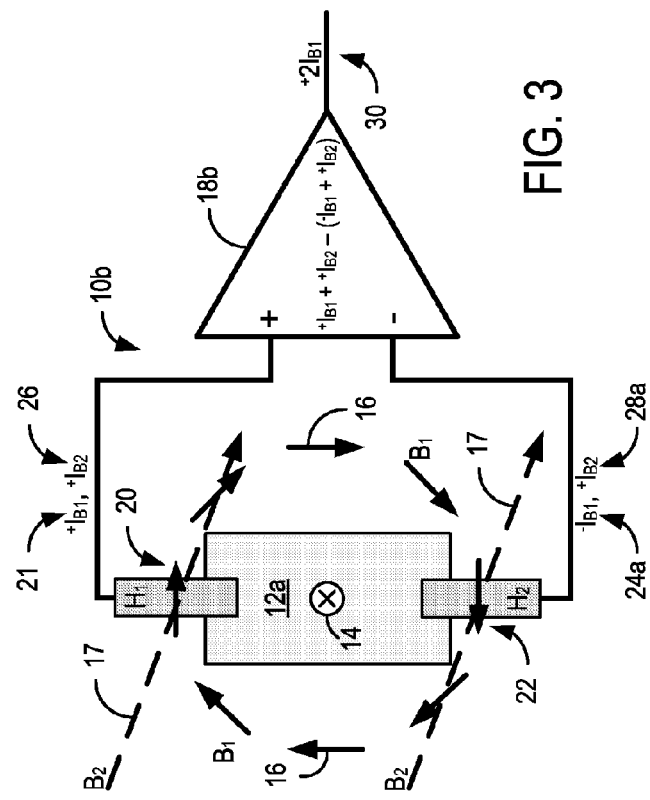
FIG. 2 is a schematic of one embodiment of the anti-differential current sensor configuration of FIG. 1 in accordance with the present invention.
Figure 3:
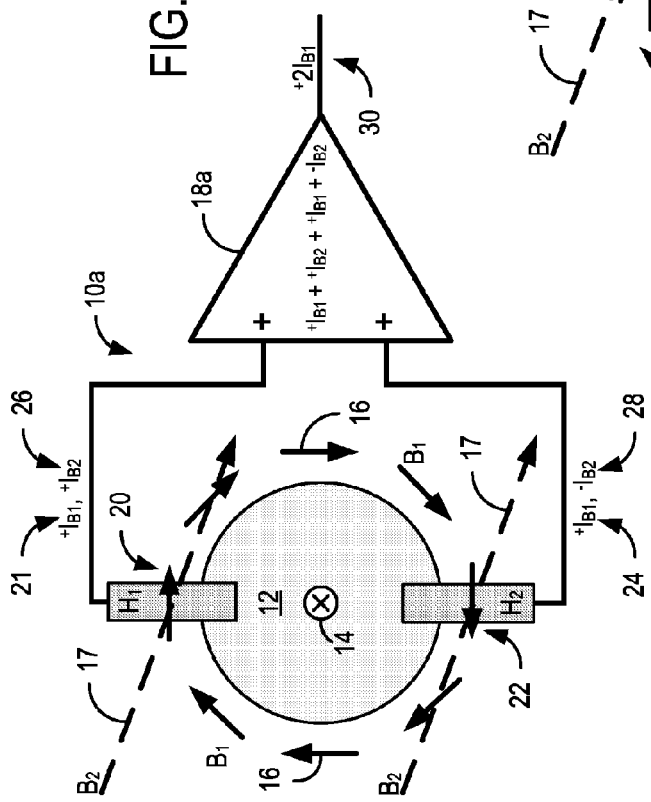
FIG. 3 is a schematic of another embodiment of the anti-differential current sensor configuration of FIG. 1 in accordance with the present invention.

The anti-differential current sensor configuration 10 may include various architectures or configurations of the current sensors $H_1$, $H_2$ and processing component 18. Referring now to FIG. 2, a first configuration of the anti-differential current sensor configuration 10a is shown. The conductor 12 is again shown with opposing Hall effect sensors $H_1$, $H_2$ disposed about a periphery of the conductor 12. FIG. 2 illustrates the conductor 12 in the form of a wire. However, it is contemplated that the conductor may be of various forms. Therefore, FIG. 2 shows the conductor 12 as a wire conductor while FIG. 3 shows a conductor 12a in the form of a bus bar. Additionally, it is contemplated that the Hall effect sensors $H_1$, $H_2$ may not only be disposed about the periphery of the conductor 12 but may be disposed within flux concentrating recesses within the conductor 12 to improve the magnetic flux detected by the Hall effect sensors $H_1$, $H_2$.

The current flow 14 through the conductor 12 is again represented as "I" and the associated magnetic field, which circles the conductor, is represented as "$B_1$," 16. According to the first configuration of the anti-differential current sensor 10a, the Hall effect sensors $H_1$, $H_2$ are not only disposed on opposite sides of the conductor 12 but are also configured to provide feedback of positively designated current flow upon detecting oppositely directed magnetic flux. That is, Hall effect sensor $H_1$ provides feedback indicating that a positive current value of magnitude "I" has been determined upon detecting a directional magnetic flux in a first direction 20. Therefore, the feedback generated by Hall effect sensor $H_1$ upon detecting directional magnetic flux $B_1$ 16 in the first direction 20 is represented as "$+I_{B1}$," 21.

On the other hand, according to the first configuration of the anti-differential current sensor 10a, Hall effect sensor $H_2$ is configured to provide feedback indicating that a positively designated current flow has been determined upon detecting a directional magnetic flux in a second direction 22. Therefore, the feedback generated by Hall effect sensor $H_2$ upon detecting directional magnetic flux $B_1$ 16 in the second direction 22 is also represented as "$+I_{B1}$," 24. Accordingly, even though the directions 20, 22 of the magnetic flux $B_1$ 16 are substantially opposite in direction when detected by Hall effect sensor $H_1$ as opposed to Hall effect sensor $H_2$, both Hall effect sensors $H_1$, $H_2$ provide positive feedback "$+I_{B1}$," 21, 24.

Following this convention, upon detecting a stray or foreign magnetic field $B_2$ 17 that is induced or generated externally to the conductor 12 and generally impinges upon each Hall effect sensor $H_1$, $H_2$ substantially equally, the Hall effect sensors $H_1$, $H_2$ provide substantially equal and opposite feedback. Specifically, unlike the magnetic field $B_1$ 16 induced by the current flow 14 through the conductor 12, which uniformly encircles the conductor 12, the externally induced magnetic field $B_2$ 17 is generally directionally uniform with respect to impinging upon the Hall effect sensors $H_1$, $H_2$. Accordingly, due to the directional configuration of the Hall effect sensors $H_1$, $H_2$, Hall effect sensor $H_1$ will provide feedback indicating a positive current flow upon detecting the magnetic field $B_2$, while Hall effect sensor $H_2$ will provide feedback indicating a negative current flow upon detecting the magnetic field $B_2$ 17. That is, Hall effect sensor $H_1$ will provide positive feedback "$+I_{B2}$," 26 while Hall effect sensor $H_2$ will provide negative feedback "$-I_{B2}$," 28.

All feedback, $+I_{B1}$, $+I_{B2}$, $+I_{B1}$, and $-I_{B2}$, is then passed to a processing component 18a. According to the first configuration of the anti-differential current sensor 10a, the processing component 18a is a summing amplifier, such as a summing operational amplifier (op amp), and is configured to provide an algebraically summed anti-differential output. However, while the processing component 18a is illustrated as a summing op amp, it is contemplated that a wide variety of processing components may be utilized. Specifically, any processing component, whether analog or digital, that is capable of generating an anti-differential sum of feedback received may be utilized within the anti-differential current sensor configuration 10a. Therefore, the term "processing component" as utilized herein is defined to include any analog, digital, or discrete components that may be configured to generate an algebraic sum of its inputs.

Therefore, the processing component 18a receives all feedback from the Hall sensors $H_1$, $H_2$ and provides a sum of $+I_{B1}++I_{B1}++I_{B2}+-I_{B2}$. As such, the feedback generated in response to the externally induced magnetic flux $B_2$ 17 ($+I_{B2}$, $-I_{B2}$) cancels and the anti-differential output 30 of the processing component 18a is generally twice the current flow 14 through the conductor 12, as determined from the magnetic field $B_1$. Therefore, regardless of the strength, direction, or concentration of extraneous magnetic fields $B_2$ 17, the output 30 of the processing component 18a is $+2I_{B1}$. The first configuration of the anti-differential current sensor configuration 10a thereby yields accurate current measurements by reducing, if not essentially removing, feedback associated with stray magnetic fields $B_2$ 17 induced or generated externally to the conductor 12 from which current feedback is desired.

Referring now to FIG. 3, a second configuration of the anti-differential current sensor 10b is shown. For exemplary purposes, FIG. 3 illustrates a conductor 12a, this time in the form of a bus bar. Again, it is contemplated that the Hall effect sensors $H_1$, $H_2$ may not only be disposed about the periphery of the conductor 12a but may be disposed within flux concentrating recesses within the conductor 12a to improve the magnetic flux detected by the Hall effect sensors $H_1$, $H_2$.

As will be described in detail below, the second configuration of the anti-differential current sensor 10b differs from the first configuration of the anti-differential current sensor 10b shown in FIG. 2 by the architecture or configuration of the Hall effect sensors $H_1$, $H_2$ and the configuration of the processing component 18b. Specifically, due to the configuration of the Hall effect sensors $H_1$, $H_2$ about the conductor 12a, the processing component 18b is configured as a differential or "differencing" amplifier.

In accordance with one embodiment, the differential amplifier is a differential op amp, configured to calculate an algebraically summed difference of the feedback received to generate an anti-differential output. However, while the processing component 18b is illustrated as a differential op amp, it is equally contemplated that a wide variety of processing components may be utilized. Specifically, any processing component, whether analog or digital, that is capable of calculating a summed difference of feedback received to generate the desired anti-differential output may be utilized within the anti-differential current sensor configuration 10b. Therefore, the term "processing component" as utilized herein is again defined to include any analog, digital, or discrete components that may be configured to generate an algebraic sum of feedback received.

According to the second configuration of the anti-differential current sensor 10b, the Hall effect sensors $H_1$, $H_2$ are disposed on opposite sides of the conductor 12a and are configured to provide equal and oppositely designated feedback of the current flow 14 through the conductor 12a upon detecting oppositely directed magnetic flux 20, 22. That is, Hall effect sensor $H_1$ provides feedback indicating that a positive current value of magnitude "I" has been determined upon detecting a directional magnetic flux in a first direction 20. Therefore, the feedback generated by Hall effect sensor $H_1$ upon detecting directional magnetic flux $B_1$ 16 in the first direction 20 is represented as "+$I_{B1}$," 21.

On the other hand, according to the second configuration of the anti-differential current sensor 10b, Hall effect sensor $H_2$ is configured to provide feedback indicating that a negatively designated current flow has been determined upon detecting a directional magnetic flux in a second direction 22. Therefore, the feedback generated by Hall effect sensor $H_2$ upon detecting directional magnetic flux $B_1$ 16 in the second direction 22 is represented as "-$I_{B1}$," 24a. Accordingly, since the directions 20, 22 of the magnetic flux $B_1$ 16 are substantially opposite when detected by Hall effect sensor $H_1$ as opposed to Hall effect sensor $H_2$, Hall effect sensors $H_1$, $H_2$ provide substantially equal feedback that is directionally opposite, "+$I_{B1}$" 21 and "-$I_{B1}$" 24a respectively. That is, the feedbacks 21, 24a are substantially equal in magnitude but each has opposite polarity.

Following this convention, upon detecting another magnetic field $B_2$ 17 that is induced or generated externally to the conductor 12a and generally impinges upon each Hall effect sensor $H_1$, $H_2$ substantially equally, the Hall effect sensors $H_1$, $H_2$ provide substantially equal feedback. Specifically, due to the directional configuration of the Hall effect sensors $H_1$, $H_2$, Hall effect sensors $H_1$, $H_2$ will both provide positive feedback 26, 28a, represented as "+$I_{B2}$," upon detecting the magnetic field $B_2$. Even slight variations in the strength of the stray magnetic fields result in little error inducement because of the relative strength of the stray fields as compared to that of the sensed conductor.

All feedback, +$I_{B1}$, -$I_{B1}$, +$I_{B2}$, and +$I_{B2}$ is then passed to the processing component 18b. As previously described, according to the second configuration of the anti-differential current sensor 10b, the processing component 18b is configured in a differential configuration to generate the desired anti-differential output eliminating feedback generated upon detecting the externally induced magnetic field $B_2$. That is, the processing component receives the feedback +$I_{B1}$, -$I_{B1}$, +$I_{B2}$, and +$I_{B2}$ and algebraically calculates a summed difference. Specifically, a summed difference is generated as (+$I_{B1}$++$I_{B2}$)-(-$I_{B1}$++$I_{B2}$) yielding +2$I_{B1}$, 30.

Therefore, through the second configuration of the anti-differential current sensor 10b includes a different configuration of the Hall effect sensors $H_1$, $H_2$ and the differential amplifier 18b rather than the summing amplifier 18a of FIG. 2, both the first configuration of the anti-differential current sensor 10a and the second configuration of the anti-differential current sensor 10b yield the same anti-differential output 30 that effectively excludes influence from externally induced magnetic fields 17. As such, both the first configuration of the anti-differential current sensor 10a and the second configuration of the anti-differential current sensor 10b provide highly accurate current measurements by reducing, if not essentially removing, feedback associated with stray magnetic fields induced or generated externally to the conductor 12a from which current feedback is desired.

These highly accurate non-contact based current measurements of the above-described current sensor configurations allow the current sensor configuration to operate in environments having various external magnetic fields without degrading current measurements from a specific conductor. However, the accuracy of the current sensor in detecting a particular magnetic field associated with a particular conductor can be improved if the current sensor is configured, for example, for the particular conductor configuration and current level being monitored. Additionally, by disposing the sensors in close proximity to the monitored conductor or within current concentrating recesses, accuracy can be improved.

By matching the Hall effect sensors, the system is substantially free of errors due to zero flux offsets and Hall effect gain differences. Furthermore, matching the Hall effect sensors substantially corrects zero flux offset drift associated with temperature fluctuations. However, for configuration utilizing a single Hall effect sensor, it is contemplated that active electronic correction may be utilized to offset zero flux offset drift associated with temperature fluctuations.

Figure 4:
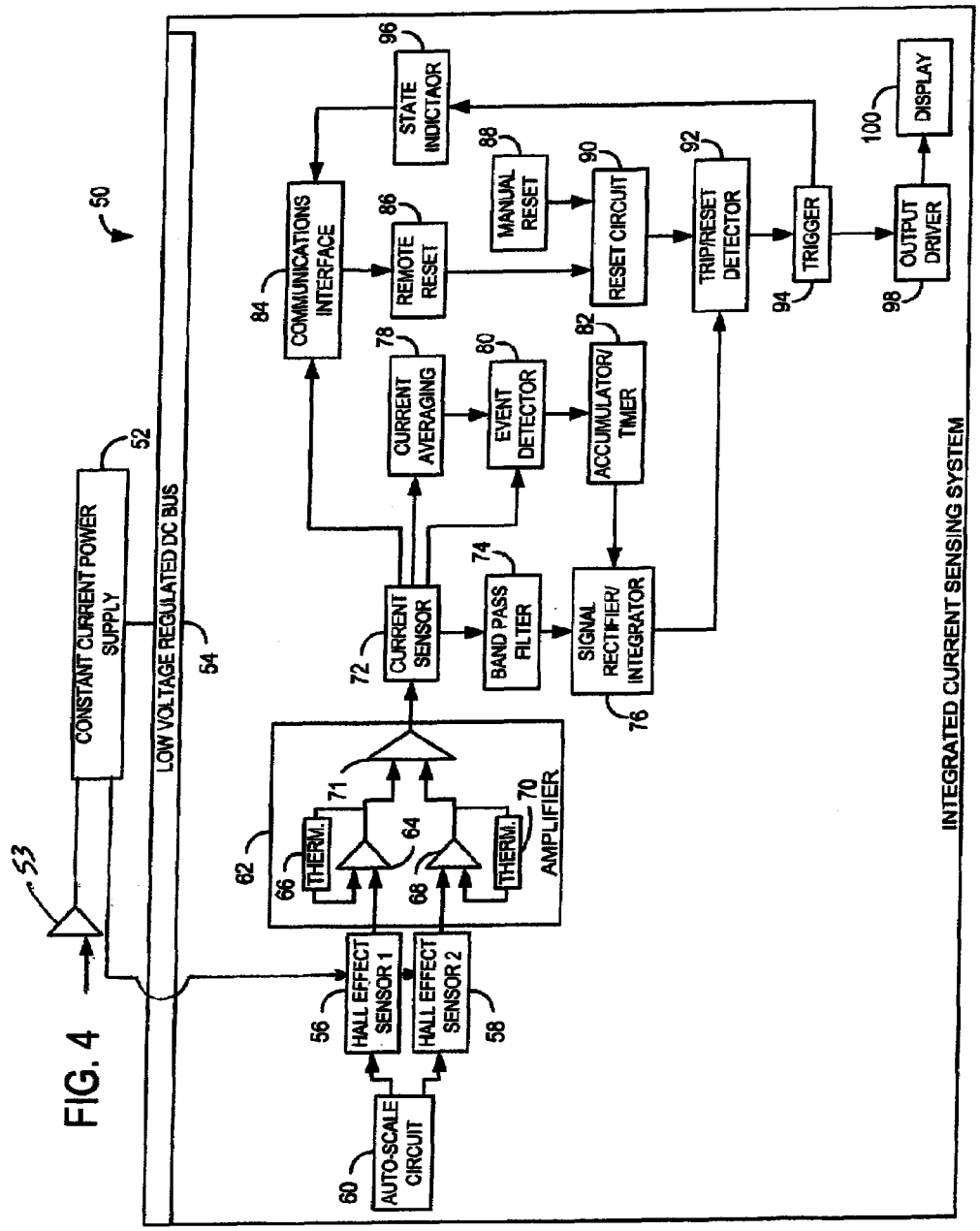
FIG. 4 is a schematic of an integrated current sensing system in accordance with the present invention.

Referring to FIG. 4, a system overview for an integrated current sensing system 50, in accordance with one embodiment of the present invention, is shown. The integrated current sensing system 50 is provided with operational power from a constant current power supply 52. The constant current power supply 52 may be configured to provide a temperature dependant power output to correct for Lorentz force temperature drift sometimes associated with Hall effect sensors. That is, the constant current power supply 52 may include a bias current compensation circuit or a temperature dependant gain adjust 53 to correct for Lorentz force sensitivity droop as operating temperature increases. The constant current power supply 52 provides power to a low voltage regulated DC bus 54 of the integrated current sensing system 50. The low voltage regulated DC bus 54, in turn, provides power to the components of the integrated current sensing system 50.

As previously described with respect to FIGS. 1-3, a first Hall effect sensor 56 and a second Hall effect sensor 58 are arranged according to an anti-differential current sensing configuration. It is contemplated that the first Hall effect sensor 56 and the second Hall effect sensor 58 may be sorted and selected in order to substantially match one another to pre-determined application-based values. Specifically, the Hall effect sensors 56, 58 may be matched to permit offset corrections to be made to compensate for any zero flux offset associated with the Hall effect sensors 56, 58. That is, by matching the Hall effect sensor 56 and the second Hall effect sensor 58, support electronics, such as an auto-scale circuit 60 or amplifier 62, may be configured to compensate for any output generated by the opposing Hall effect sensor configuration 56, 58 when a zero flux condition exists.

As stated, the integrated current sensing system 50 includes an auto-scale circuit 60 that allows user configuration to gain maximized resolution and range. Once a resolution and range are selected, the first Hall effect sensor 56 and the second Hall effect sensor 58 provide feedback to the amplifier 62. The amplifier 62 includes a plurality of processing components, preferably op amps. Again, the amplifier 62 or "processing components" may include analog, digital, or discrete components.

Feedback from the first Hall effect sensor 56 is provided to an initial processing component 64 including a temperature dependent gain loop 66 configured to correct for zero-flux electronic drift associated with operational temperature changes. Similarly, feedback from the second Hall effect sensor 58 is provided to another initial processing component 68 including a respective temperature dependent gain loop 70 configured to correct for zero-flux electronic drift associated with operational temperature changes. The output from the initial processing components 64, 68 are provided to a primary processing component 71, preferably an op amp. Again, depending upon the configuration of the Hall effect sensors 58, 62, the processing component may be configured to sum or differentiate the feedback received from the first Hall effect sensor 56 and the second Hall effect sensor 58 in order to calculate the desired anti-differential output thereby removing feedback indicative of externally induced magnetic fields.

The anti-differential output of the amplifier 62 is then provided to a current sensor 72 to determine the actual current detected by the first Hall effect sensor 56 and the second Hall effect sensor 58. For example, as previously described, the anti-differential output of the amplifier 62 may be twice the actual value of the current flow through the monitored conductor. As such, the current sensor 72 may be configured to divide the anti-differential output of the amplifier 62 in half. Additionally, it is contemplated that the current sensor 72 may perform additional sensing, extrapolation, and corrective functions on the anti-differential output of the amplifier 62 before communicating feedback to other components of the integrated current sensing system 50.

The output of the current sensor 72 may be provided to a band pass filter 74 and signal rectifier/integrator 76 for arc fault detection algorithms for both alternating current (AC) faults and direct current (DC) faults. Additionally, the output of the current sensor 72 may be provided to a current averaging circuit 78 and event detector 80 that, in turn, communicate with an accumulator/timer 82. Furthermore, the output of the current sensor 72 may be directly communicated to a communications interface 84. The communications interface 84 may be configured to utilize an external communications system to provide alerts and information to operators via wireless, power line encoded, or other communications systems. As such, direct communication of real-time current information may be achieved.

The real-time current information communicated via the communications interface 84 may be utilized by operators to perform a variety of processing functions and to communicate commands back to the integrated current sensing system 50. As such, the communications interface 84 is connected to a remote reset 86 so that remote resetting of the integrated current sensing system 50 may be achieved. Also, a manual reset 88 may be included to facilitate local operator resets of the integrated current sensing system 50. Whether communicated from the remote reset 86 or manual reset 88, a reset circuit 90 functions to carry out the desired reset of the integrated current sensing system 50.

The reset circuit 90 is configured to communicate with a trip/reset detector 92 that monitors the current function of the integrated current sensing system 50 and communicates feedback to a trigger 94. The trigger 94 identifies and serves to trigger operational state changes to and from states such as a normal operational state, a trip state, a reset state, and the like. The current operational state of the integrated current sensing system 50 is then tracked and communicated by a state indicator 96. The state indicator 96 is configured to communicate with the communications interface 84 to provide feedback regarding the current operational state of the integrated current sensing system 50 to local or remote operators. An output driver 98 may also be included to provide a variety of functionalities. For example, the output driver 98 may control local display of feedback via a display 100 or operate in accordance with an arc fault detection algorithm.

Therefore, the integrated current sensing system 50 serves as an integrated device configured to combine magnetic field sensing components with a circuit board assembly that may include circuit braking, communications, and arc fault detecting components. By combining the current sensor components into a single assembly, mechanical support, accurate alignment, as well as intersystem interconnection and communication are achieved while reducing size constraints.

Figure 5:
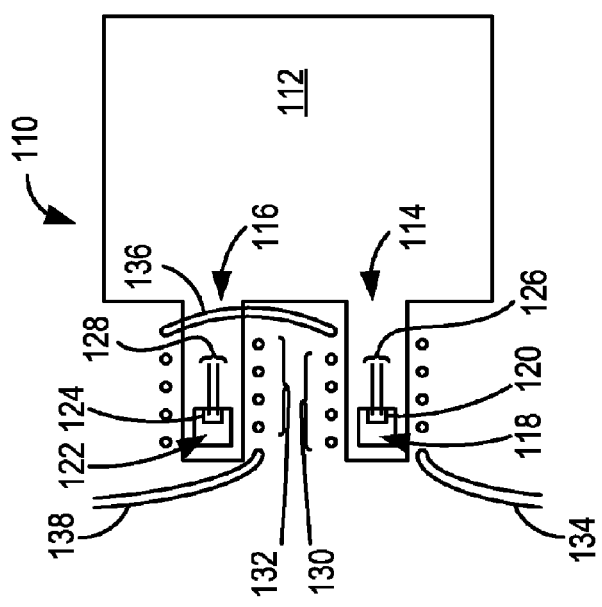
FIG. 5 is a plan view of one embodiment of the integrated current sensing system of FIG. 4, in accordance with the present invention.

Referring now to FIG. 5, one particular configuration for a PC board integrated current sensing system 110 is shown. The PC board integrated current sensing system 110 includes a PC board 112 which may be configured to include any of the various components and systems previously described with respect to FIG. 4. The PC board 112 includes a first finger or arm 114 and a second finger or arm 116. Disposed within the first finger 114 is a cut-away section 118 configured to receive a magnetic flux sensor 120, preferably a Hall effect sensor. The magnetic flux sensor 120 is directly connected to the PC board 112 by two leads 126 connected on a first side of the PC board 112 and the other two leads (not shown) connected on the other side of the PC board 112. As such, the magnetic flux sensor 120 may be integrated with other systems and components contained on the PC board 112.

Similarly, disposed within the second finger 116 is a cut-away section 122 configured to receive another magnetic flux sensor 124, preferably a Hall effect sensor. The magnetic flux sensor 124 is also directly connected to the PC board 112 by a pair of leads 128 on one side of the PC board 112 and the remaining two leads (not shown) connected to the other side of the PC board 112. As such, the magnetic flux sensor 124 may be integrated with other systems and components contained on the PC board 112.

Surrounding the first finger 114 and the second finger 116 are corresponding conductive coils 130, 132, shown in cross section. An input lead 134 provides an electrical path for the connection of a current flow into the PC board integrated current sensing system 110. Current flow from the input lead 134 enters the first conductive coil 130 and spirals toward a cross-over conductive path 136 to the second conductive coil 132. Upon entering the second conductive coil 132, current flow is caused to flow in a direction substantially opposite to the spiral of the first conductive coil 130. For example, should the first conductive coil 130 spiral in a clockwise direction, the second conductive coil 132 is configured to spiral in counter-clockwise direction. Accordingly, the direction of the magnetic flux induced by current flow through the first conductive coil 130 is substantially opposite to the direction of the magnetic flux induced by current flow through the second conductive coil 132. After passing though the second conductive coil 132, the current flow leaves the integrated current sensing system 110 via an output lead 202.

The first magnetic flux sensor 120 and the second magnetic flux sensor 124 are configured to provide feedback in response to detecting a magnetic flux induced by current flow through each respective conductive coil 130, 132 that includes a magnitude and directional indication. As such, as previously described, feedback generated by the first magnetic flux sensor 120 and the second magnetic flux sensor 186 in response to detecting externally induced magnetic fields can be substantially canceled to provide a highly accurate reading of the current flow through the conductive coils 130, 132.

Therefore, a current sensor 110 is created that includes a pair of air core coils 130, 132 designed to concentrate a detectable magnetic flux. Externally induced magnetic flux imparts an error upon the pair of current sensors 118, 124 that can be removed from an anti-differential output, as described with respect to FIGS. 1-3. That is, when the feedback from the sensors is provided to a summing or differential device, such as an amplifier, the influence from externally induced magnetic fields is canceled.

Accordingly, a highly accurate and compact current sensor is constructed and integrated with a PC board system 110 that may include additional system and components as described with respect to FIG. 4. Furthermore, by integrating such systems and components, size reductions of the overall system may be achieved. As will be described, the PC board integrated anti-differential current sensing system 110 may be disposed within a housing to provide an assembly and support structure for component positioning and alignment.

Figure 6:
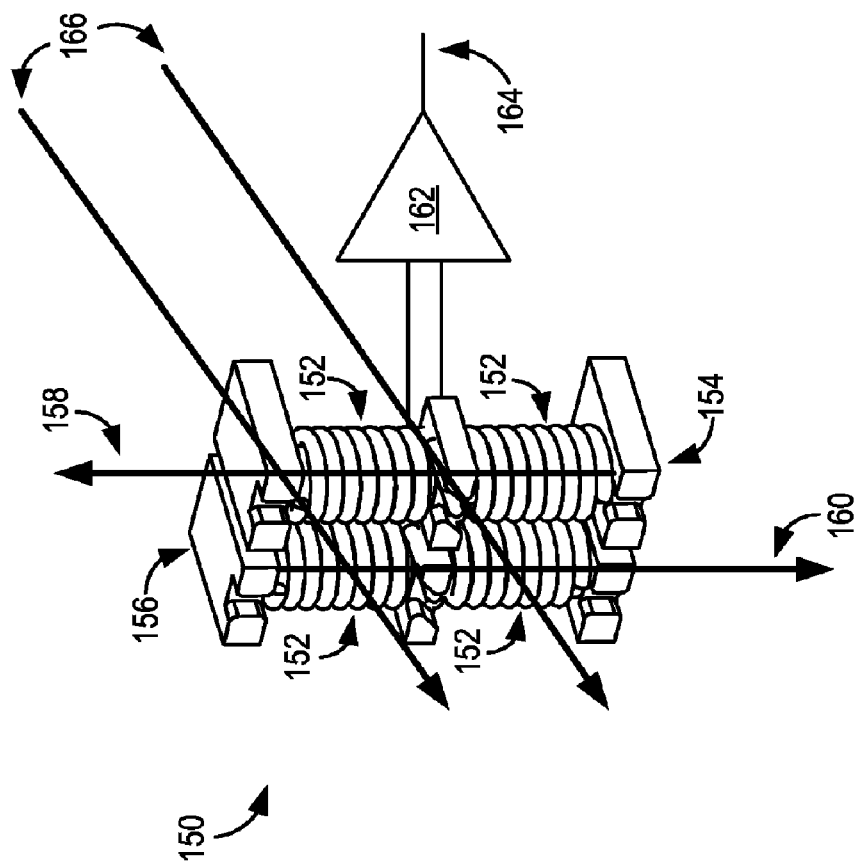
FIG. 6 is a perspective view of an alternative winding configuration of the integrated current sensing system of FIG. 5, in accordance with the present invention.

Referring now to FIG. 6, another magnetic flux concentrating current sensor configuration 150 is shown. In this case a quad-helix coil design is employed as opposed to the dual-helix design described with respect to FIG. 5. Specifically, the flux concentrator is formed by a plurality of conductive wire spirals 152. The conductive wire spirals 152 form a quad-helix concentrator that concentrates magnetic flux induced by current flow through the conductive wire spirals 152. Specifically, the conductive wire spirals 152, which essentially form one conductive path, include two opposingly spiraled conductive paths 154, 156. As current flows through one conductive path 154, a first magnetic flux is concentrated in a first direction 158. Furthermore, as current flows through the other conductive path 156 of the flux concentrator 150, a second magnetic flux is concentrated in a second direction 160.

A first Hall effect sensor (not shown) is disposed within one spiraled conductive path 154 and a second Hall effect sensor (not shown) is disposed with the other spiraled conductive path 156. As described with respect to FIGS. 1-3, the Hall effect sensors along with a processing component 162 are configured according to an anti-differential topology to provide feedback from the Hall effect sensors to the processing component 162 to calculate an anti-differential output 164. Again, the anti-differential output 164 is substantially free of feedback attributable to magnetic fields 166 induced externally from the flux concentrator 150. By concentrating the magnetic fields 158, 160 induced by current flow through the spiraled conductive paths 154, 156, the affects of stray magnetic fields 166 are reduced and improved current sensing of even relatively low current flow through the flux concentrator 150 is achieved.

Again, further advantages are gained by matching the Hall effect sensors. That is, if properly matched, the system is substantially free of errors due to zero flux offsets and Hall effect gain differences. Furthermore, matching the Hall effect sensors substantially corrects zero flux offset drift associated with temperature fluctuations. However, for a configuration utilizing a single Hall effect sensor, it is contemplated that active electronic correction may be utilized to offset zero flux offset drift associated with temperature fluctuations. Furthermore, a constant current power supply may be utilized having a bias current compensation circuit or a temperature dependent adjustable gain to compensate for Hall gain drift. Additionally or alternatively, the processing component includes a temperature dependant op-amp gain loop configured to compensate for temperature dependent electronic drift. Also, Lorentz force drifts associated with temperature variations can be corrected using by the temperature dependent supply to power the anti-differential current sensor.

Figure 7:
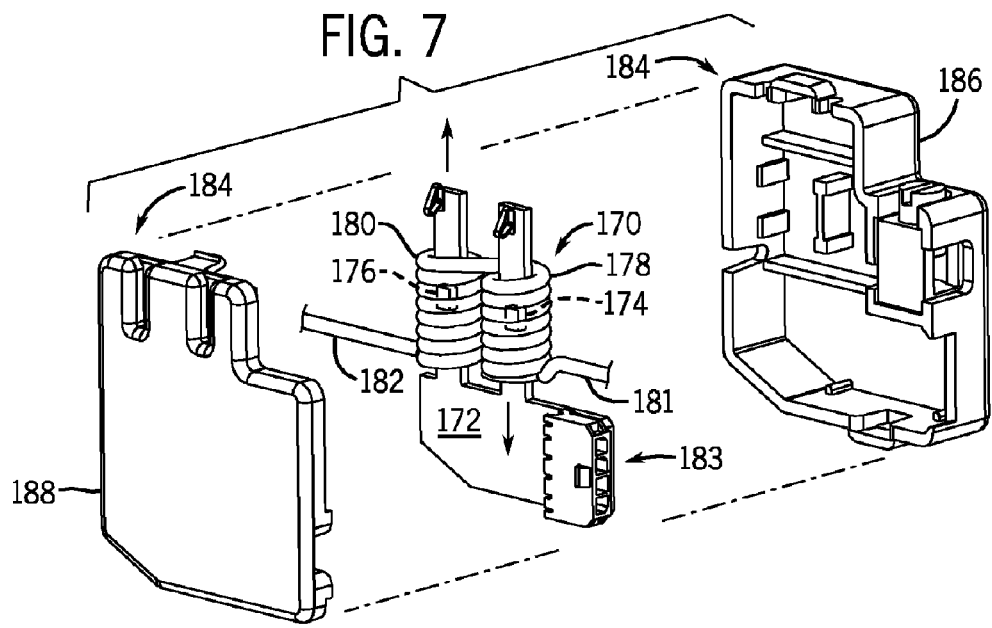
FIG. 7 is a perspective exploded view of the integrated current sensing system of FIG. 5, in accordance with the present invention.

Referring now to FIG. 7, one embodiment of an integrated current sensing system 170 is shown exploded. The integrated current sensing system 170 includes a PC board 172 whereon a pair of Hall effect sensors (shown in phantom) 174, 176 are mounted and configured according to an anti-differential topology, as described with respect to FIGS. 1-3. The Hall effect sensors 174, 176 are disposed within respective spiral coils 178, 180 that are configured to concentrate flux induced by current flow through the spiral coils 178, 180 about the Hall effect sensors 174, 176. Again, the spiral coils 178, 180 include directional spiraling that is substantially opposite in direction to one another in accordance with the previously-described anti-differential topology.

The PC board 172 is configured to include various systems and subsystems, for example a circuit breaker, as described with respect to FIG. 4. Accordingly, mounted to the PC board 172 is a data port 183 which serves as a communications interface for transmission of information such as the anti-differential output of the integrated current sensing system 170. The integrated current sensing system 170 includes a housing 184 comprised of two portions 186, 188 that, when joined, engage the PC board 172 and accompanying components to properly position such and secure against dislodgement or movement. The housing 184 includes a plurality of cut away portions 190 configured to receive an input terminal 181, output terminal 182, and data port 183 to provide access to such components while the housing portions 186, 188 are joined, thereby enclosing and protecting the PC board 172, Hall effect sensors 174, 176, and spiral coils 178, 180. Specifically, the spiral coils 178, 180 are configured to receive current flow through an input terminal 181, concentrate magnetic flux about the Hall effect sensors 174, 176 as the current flow passes through the spiral coils 178, 180, and release current through an output terminal 182.

Figure 8:
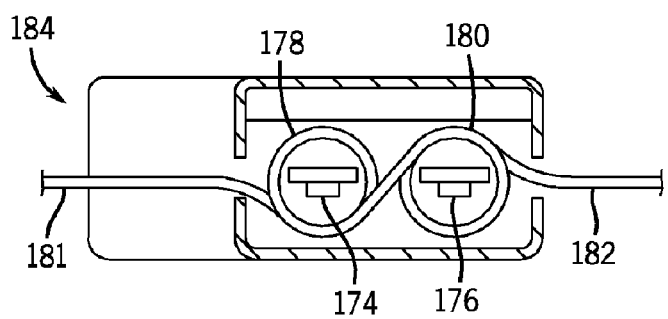
FIG. 8 is a plan view of the integrated current sensing system of FIG. 7, in accordance with the present invention.

Referring now to FIG. 8, a plan view of the integrated current sensing system 170 of FIG. 7 is shown. The housing 184 forms an enclosure surrounding the Hall effect sensors 174, 176 and spiral coils 178, 180. As such, the input terminal 181 and output terminal 182 provide access through the housing 184 to provide ingress and egress for current flow to the current sensing system 170 through the housing 184.

Referring now to FIG. 9, another embodiment of an integrated current sensing system 200 is shown in an exploded view. Specifically, as will be described with respect to FIG. 10, the integrated current sensing system 200 is configured to engage a bus bar conductor (not shown). The integrated current sensing system 200 includes a PC board 202. Connected to the PC board 202 are a pair of Hall effect sensors 204, 206 that are configured according to an anti-differential topology, as described with respect to FIGS. 1-3. Specifically, one Hall effect sensor 204 is mounted to the PC board 202 and the other Hall effect sensor 206 is connected via a wired connection 208. Accordingly, the Hall effect sensors 204, 206 are disposed substantially opposite one another according to the previously-described anti-differential topology.

The PC board 202 is configured to include various systems and subsystems, as described with respect to FIG. 4. A data port 210 is also mounted to the PC board 202 which serves as a communications interface for transmission of information such as the anti-differential output of the integrated current sensing system 200. The integrated current sensing system 200 includes a housing 212 comprised of two portions 214, 216 that, when joined, engage the PC board 202 and accompanying components to properly position such and secure against dislodgement or movement.

A fastener 218 is included and, as will be described with respect to FIG. 10, is configured to engage a bus bar conductor. Referring to FIG. 10, a plan view of the integrated current sensing system 200 of FIG. 9 is shown. The fastener 218 is configured to engage a bus bar conductor 220 and secure the housing 212 and associated components thereto. In particular, the fastener 218 is slideably engaged with the housing 212 and includes a ridged or toothed portion 218 that engages a retention clip 222. Accordingly, the fastener 218 can be adjusted to securely fasten the housing 212 to a variety of conductor sizes and shapes.

The housing 212 forms an enclosure arranging the Hall effect sensors 204, 206 substantially opposite one another such that when secured to the bus bar 220, the Hall effect sensors 204, 206 are positioned on opposite sides of the bus bar conductor 220. Accordingly, Hall effect sensors 204, 206 are arranged in an anti-differential topology, as described with respect to FIGS. 1-3. That is, upon securing the housing 212 to the bus bar conductor 220 using the fastener 218, the Hall effect sensors 204, 206 are properly positioned about the bus bar conductor 220 to perform current monitoring and generate an anti-differential output indicating current flow through the bus bar 220 that is substantially free of errors. The PC board 202 and data port 210 facilitate communication between the Hall effect sensors 204, 206 and various systems and subsystems incorporated therein and/or externally from the housing 212.

Figure 11:
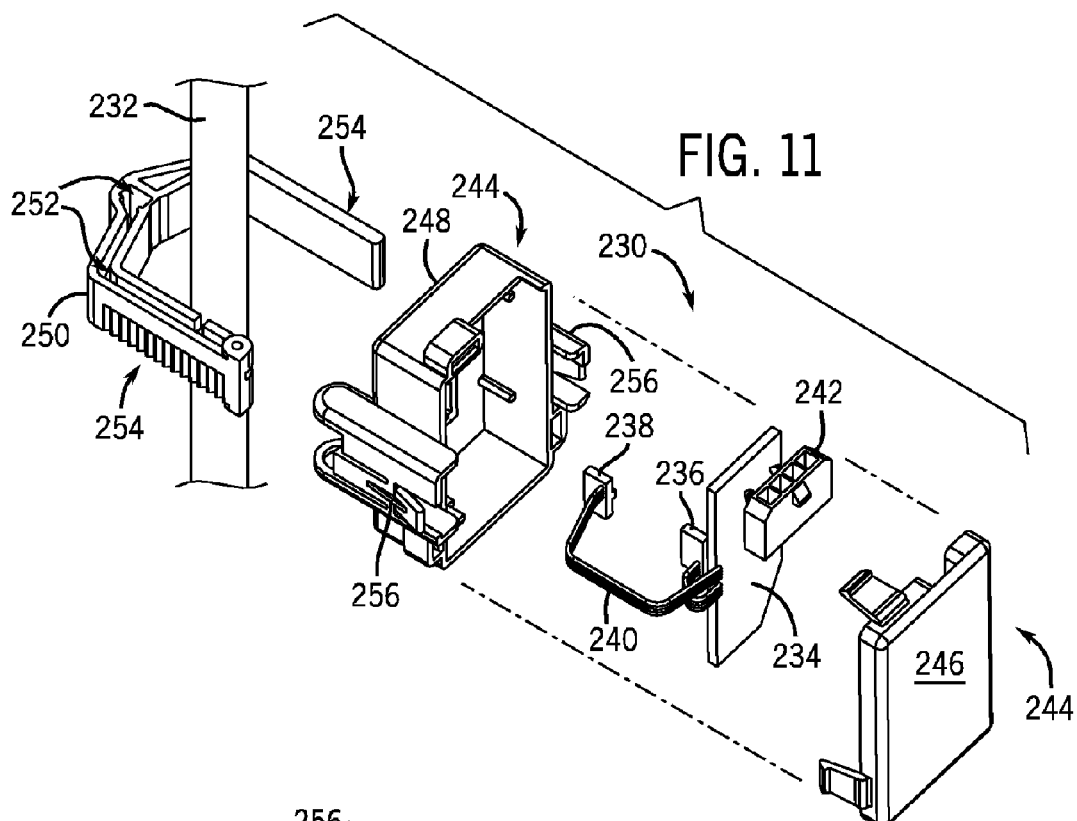
FIG. 11 is a perspective exploded view of an alternate embodiment of the integrated current sensing system of FIG. 4, in accordance with the present invention.

Referring now to FIG. 11, another embodiment of an integrated current sensing system 230 is shown in an exploded view. This embodiment of the integrated current sensing system 230 includes a PC board 234. Connected to the PC board 234 are a pair of Hall effect sensors 236, 238 that are configured according to an anti-differential topology, as described with respect to FIGS. 1-3. Specifically, one Hall effect sensor 236 is mounted to the PC board 234 and the other Hall effect sensor 238 is connected via a wired connection 240 such that the Hall effect sensors 236, 238 are disposed substantially opposite one another.

The PC board 234 is configured to include various systems and subsystems, as described with respect to FIG. 4. A data port 242 is also mounted to the PC board 234 which serves as a communications interface for transmission of information such as the anti-differential output of the integrated current sensing system 230. The integrated current sensing system 230 includes a housing 244 comprised of two portions 246, 248 that, when joined, engage the PC board 234 and accompanying components to properly position such and secure against dislodgement or movement.

A fastener 250 is included that is configured to engage the wire conductor 232. A recess 252 is formed in the fastener 250 to receive the Hall effect sensor 238 and connecting wire 240. The Hall effect sensor 238 and associated wire 240 are configured to be disposed within the recess 252 of the fastener 250 such that the Hall effect sensors 236, 238 are disposed substantially opposite one another on opposing sides of the wire conductor 232.

The fastener 250 is configured to engage the wire conductor 232 and secure the housing 244 and associated components thereto. In particular, the fastener 250 includes a ridged or toothed portion 254 that engages retention clips 256 integrated with the housing 244. Accordingly, the fastener 250 can be slideably adjusted to securely fasten the housing 244 to a variety of conductor sizes and shapes.

Figure 12:
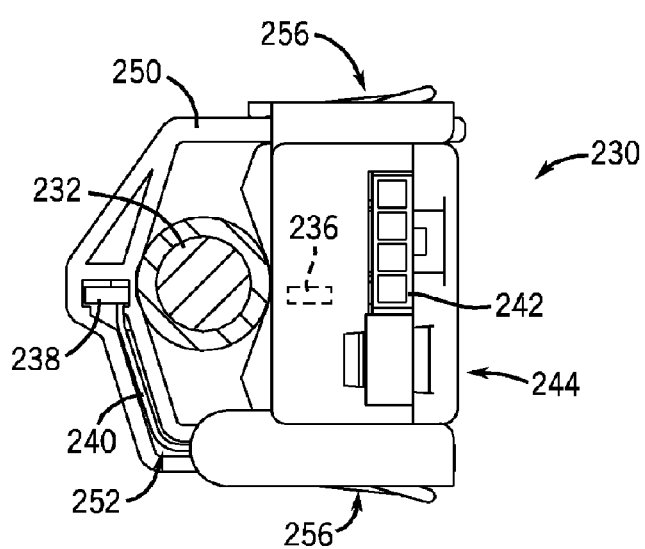
FIG. 12 is a side view of the integrated current sensing system of FIG. 11, in accordance with the present invention.

Referring now to FIG. 12, a plan view of the integrated current sensing system 230 of FIG. 11 is shown. The fastener 250 is engaged with the housing 244 and secured by the retention clips 256 to fasten the housing 244 to the wire conductor 232. The housing 212 and fastener 250 form an enclosure arranging the Hall effect sensors 236, 238 substantially opposite one another such that when secured to the wire conductor 232. The Hall effect sensors 236, 238 are positioned on opposite sides of the wire conductor 232 in an anti-differential topology, as described with respect to FIGS. 1-3. That is, upon securing the housing 244 to the wire conductor 232 using the fastener 250, the integrated current sensor 230 is properly positioned about the wire conductor 232 to perform current monitoring and generate an anti-differential output indicating current flow through the wire conductor 232 that is substantially free of errors.

The fastener configurations shown in FIGS. 9-12 are for exemplary purposes only. It is contemplated that a variety of fasteners and fastener configurations may be utilized to engage a variety of conductors shapes and configurations. For example, it is contemplated that an adjustable clip, an adjustable strap, or a compression fitting may be utilized to engage a variety of conductor configurations and arrange the integrated current sensing system about the conductor according to the above-described anti-differential, error correcting topology.

The present invention yields error correcting for externally induced magnetic fields for current sensing and monitoring of both AC and DC power sources. The anti-differential output generated is high fidelity due to the absence of magnetic core materials. Low inductance, achieved as a function of an air core configuration, allows the current sensor configuration to be highly responsive to change as well as provides in-phase, real-time, current feedback vectors. The sensor configuration includes wide and dynamic range abilities due to the absence of permeable materials and the absence of a saturation point.

Additionally, the absence of non-linear saturating or ferromagnetic core materials eliminates DC error offsets associated with hysteresis of ferromagnetic materials and allows the current sensor configuration to be utilized to monitor AC and DC circuits. Therefore, the system generates an anti-differential output that is substantially free of variations due to hysteresis, magnetic core saturation, and eddy currents because the system is substantially free of ferromagnetic field concentrating materials. Furthermore, the elimination of metallic core materials reduces the overall size of the current sensor configuration and lowers consumed power. The sensor configuration is flexibly deployable to conductors including current flows from a few milli-amps to a few thousand amps.

By matching the Hall effect sensors, the system is substantially free of errors due to zero flux offsets and Hall effect gain differences. Furthermore, matching the Hall effect sensors substantially corrects any zero flux offset drift associated with temperature fluctuations. Furthermore, a constant current power supply may be utilized having a bias current compensation circuit or a temperature dependent adjustable gain to compensate for Hall gain drift. Additionally or alternatively, the processing component includes a temperature dependant op-amp gain loop configured to compensate for temperature dependent electronic drift. Also, Lorentz force drifts associated with temperature variations can be corrected using by the temperature dependent supply to power the anti-differential current sensor.

While the above-described technique has been described with respect to current monitoring systems, it is equivalently applicable for voltage and/or power monitoring systems. That is, it is contemplated that additional systems and subsystems may be utilized with the above described techniques and topologies to equivalently generate highly accurate voltage and/or power measurements.

Therefore, the present invention includes a current sensor having a first Hall effect sensor and a second Hall effect sensor constructed to provide feedback indicating current flow through a conductor susceptible to external magnetic flux. A housing is configured to position the first Hall effect sensor and the second Hall effect sensor about the conductor to provide generally magnitude equal feedback of the current flow through the conductor and generally polarity opposite feedback of the external magnetic flux.

According to another embodiment of the invention, a current sensor includes a PC board configured to receive a plurality of components and a conductive path disposed proximate to the PC board. A first Hall effect sensor and a second Hall effect sensor are each configured to be mounted to the PC board and adjacent the conductive path to provide feedback indicating a current flow through the conductive path. A processing component is configured to receive the feedback from the first Hall effect sensor and the second Hall effect sensor and calculate an anti-differential output from the feedback that substantially removes feedback in response to magnetic flux induced externally from the conductive path.

Another embodiment of the present invention includes a current sensing system including a conductor configured to conduct a current flow therethrough and a housing configured to be mounted to the conductor. A first Hall effect sensor is configured to be fixed within the housing and to provide a first indication of current flow through the conductor and a second Hall effect sensor is configured to be fixed within the housing and to provide a second indication of current flow through the conductor. A processing component is configured to receive the first indication of current flow and the second indication of current flow and calculate at least one of a sum and a difference of the first indication of current flow and the second indication of current flow to generate an anti-differential output that reduces errors generated by magnetic fields induced thereon from sources external from the conductive path.

The present invention has been described in terms of the preferred embodiment, and it is recognized that equivalents, alternatives, and modifications, aside from those expressly stated, are possible and within the scope of the appending claims.

What is claimed is:

1. A current monitoring system comprising:
   a conductive path configured to receive a current therethrough;
   a first current sensor positioned on a first side of the conductive path and configured to monitor a first directional magnetic field induced by the current;
   a second current sensor positioned on a second side of the conductive path, substantially opposite the first current sensor, and configured to monitor a second directional magnetic field induced by the current that is substantially opposite in direction to the first directional magnetic field;
   a processing component configured to receive feedback from the first current sensor and the second current sensor and generate an anti-differential output from the feedback; and
   a constant current power supply configured to adjust a bias power to the first current sensor and the second current sensor to compensate for temperature dependent electronic drift.

2. The system of claim 1 wherein the processing component includes at least one of a summing amplifier and a differential amplifier.

3. The system of claim 1 wherein the first current sensor includes a first Hall effect sensor and the second current sensor includes a second Hall effect sensor.

4. The system of claim 3 wherein the first Hall effect sensor is configured to generate a first feedback upon detecting the first directional magnetic field induced by the current through the conductive path and the second Hall effect sensor is configured to generate a second feedback upon detecting the second directional magnetic field induced by the current through the conductive path.

5. The system of claim 4 wherein the first feedback generated by the first Hall effect sensor includes an indication of another current upon detecting a directional magnetic field induced externally to the conductive path and the second feedback generated by the second Hall effect sensor includes an indication of another current upon detecting the directional magnetic field induced externally to the conductive path.

6. The system of claim 5 further comprising generating the anti-differential output from the first feedback and the second feedback to reduce the indication of the another current.

7. The system of claim 3 wherein the anti-differential output is substantially free of variations due to changes in operating temperatures of the first Hall effect detector and the second Hall effect detector and substantially free of variations due to hysteresis, magnetic core saturation, and eddy currents.

8. The system of claim 3 wherein the constant current power supply further comprises at least one of a bias current compensation circuit and a temperature dependent adjustable gain configured to compensate for Hall gain drift.

9. The system of claim 1 wherein the first current sensor and the second current sensor are substantially free of ferromagnetic field concentrating materials.

10. The system of claim 1 further comprising an adjacent conductive path positioned proximate to the conductive path and having a current flow therethrough.

11. The system of claim 10 wherein the first current sensor, the second sensor, and the processing component are configured to perform common mode error correcting to substantially eliminate feedback attributable to the adjacent conductive path from the anti-differential output.

12. The system of claim 1 wherein the processing component includes a temperature dependant op-amp gain loop configured to adjust the feedback from the first and second current sensors to compensate for temperature dependent electronic drift.

13. A current sensor comprising:
a first Hall effect sensor positioned proximate to a conductor and configured to provide a first feedback indicative of a current flow through the conductor;
a second Hall effect sensor positioned proximate to the conductor and configured to provide a second feedback indicative of the current flow through the conductor;
a processing device configured to generate a summed difference of the first feedback and the second feedback to reduce feedback corresponding to magnetic fields induced externally from the conductor; and
a constant current power supply configured to automatically adjust current to the first Hall effect sensor and the second Hall effect sensor in proportion to a temperature input to compensate for Hall gain drift of the first Hall effect sensor and the second Hall effect sensor.

14. The current sensor of claim 13 wherein the first Hall effect sensor is positioned on a first side of the conductor and the second Hall effect sensor is positioned on a second side of the conductor, wherein the first side of the conductor is substantially opposite the second side of the conductor.

15. The current sensor of claim 13 wherein the first Hall effect sensor is configured to provide feedback having a first polarity upon detecting magnetic fields induced by current flow through the conductor and the second Hall effect sensor is configured to provide feedback having a second polarity upon detecting magnetic fields induced by current flow through the conductor.

16. The current sensor of claim 15 wherein the first Hall effect sensor and the second Hall effect sensor are configured to provide feedback having the first polarity upon detecting magnetic fields induced externally from the conductor.

17. The current sensor of claim 16 wherein the processing component includes a differential amplifier configured to sum the difference of the feedback having the first polarity and the feedback having the second polarity to substantially remove feedback generated upon detecting magnetic fields induced externally from the conductor.

18. The current sensor of claim 13 wherein the processing component includes an amplifier configured to calculate at least one of a sum and a difference of the first feedback and the second feedback to generate the summed difference.

19. The current sensor of claim 13 wherein the constant current power supply comprises at least one of a bias current compensation circuit and a temperature dependent adjustable gain configured to compensate for Hall gain drift of the first Hall effect sensor and the second Hall effect sensor.

20. The current sensor of claim 13 wherein the summed difference is substantially free of variations due to changes in operating temperatures of the first Hall effect detector and the second Hall effect detector.

21. The current sensor of claim 13 wherein the current sensor is substantially free of ferromagnetic core materials.

22. The current sensor of claim 13 wherein the summed difference is substantially free of variations due to hysteresis, magnetic core saturation, and eddy currents.

23. The current sensor of claim 13 wherein the summed difference is zero when no current flow is present through the conductor.

24. A method of determining current flow through an electrical path comprising the steps of:
generating a first feedback represented by a first vector having a first direction and a first magnitude upon detecting a first direction of magnetic flux induced by a current flow through an electrical path and a second vector having the first direction and a second magnitude upon detecting a second direction of magnetic flux induced externally from the electrical path;
generating a second feedback represented by a third vector having the first direction and the first magnitude upon detecting a third direction of magnetic flux induced by the current flow through the electrical path and a fourth vector having a second direction and the second magnitude upon detecting the second direction of magnetic flux induced externally from the electrical path;
summing the first feedback and the second feedback to create an anti-differential sum thereby substantially canceling the effects of the first feedback and the second feedback represented by the second vector and the fourth vector; and
adjusting a bias current to at least one current sensor to correct for electronic drift associated with temperature variations.

25. The method of claim 24 further comprising the step of correcting for Lorentz force drifts associated with temperature variations by providing a temperature dependent supply of power to a sensor system configured to generate the first feedback and the second feedback.

26. The method of claim 24 wherein the step of correcting for electronic drift associated with temperature variations is performed by at least one temperature dependant gain adjust.

27. The method of claim 24 wherein the first direction of magnetic flux and the third direction of magnetic flux are substantially opposite.

28. The method of claim 24 wherein the steps of generating the first feedback and generating the second feedback include monitoring at least one of a conductive wire, a bus bar, and an integrated circuit (IC) board etching to determine the first, second and third directions of magnetic flux.

29. The method of claim 24 wherein the steps of generating the first feedback and generating the second feedback further comprises receiving feedback from at least two Hall sensors configured to detect oppositely directed magnetic flux induced by current flow through the electrical path to generate the first feedback and the second feedback.

30. The method of claim 29 further comprising compensating for a Hall voltage zero flux offset by matching the at least two Hall sensors.

31. The method of claim 29 further comprising removing phase shifts such that the anti-differential sum is in phase with current flow through the electrical path.

32. An anti-differential current sensing system comprising:
   an electrically conductive path;
   a first Hall effect sensor disposed proximate to a first side of the electrically conductive path and configured to generate a first measure of a current flow through the electrically conductive path by monitoring magnetic fields;
   a second Hall effect sensor disposed proximate to a second side of the electrically conductive path, substantially opposite the first side of the electrically conductive path, and configured to generate a second measure of the current flow through the electrically conductive path by monitoring magnetic fields;
   a processing device configured to receive the first measure of the current flow and the second measure of the current flow and generate an output from the first measure of the current flow and the second measure of the current flow substantially free of errors due to magnetic fields generated externally from the conductive path; and
   at least one circuit configured to compensate for temperature dependent electronic drift by adjusting a bias current of the first Hall effect sensor and the second Hall effect sensor proportionately to a temperature input.

33. The system of claim 32 wherein the processing device includes at least one of a summing amplifier and a differential amplifier configured to reduce the first measure of the current and the second measure of the current by an amount attributable to magnetic fields induced externally to the electrically conductive path.

34. The system of claim 33 wherein the processing device includes an op-amp.

35. The system of claim 32 wherein the first Hall effect sensor and the second Hall effect sensor are positioned about a periphery of the electrically conductive path.

36. The system of claim 32 wherein the current flow through the electrically conductive path includes at least one of a direct current (DC) and an alternating current (AC).

37. The system of claim 32 wherein a summed difference of the first measure of the current flow and the second measure of the current flow is substantially free of variations due to hysteresis, magnetic core saturation, and eddy currents.

38. The system of claim 32 wherein the first current sensor and the second current sensor are matched to provide feedback such that a summed difference of the first measure of the current flow and the second measure of the current flow is zero when no current flow is present through the electrically conductive path.

39. A current sensor system comprising:
   means for carrying current;
   means for generating a first feedback upon detecting magnetic flux in a first direction induced from the means for carrying current;
   means for generating a second feedback upon detecting magnetic flux in a second direction induced from the means for carrying current, wherein the first direction is substantially opposite the direction; and
   means for generating an anti-differential sum from the first feedback and the second feedback to reduce feedback generated upon detecting stray magnetic flux means for automatically controlling the means for generating the first feedback and the means for generating the second feedback to correct errors induced by operational temperature variations.

* * * * *